United States Patent
Arita

(10) Patent No.: US 6,969,669 B2
(45) Date of Patent: Nov. 29, 2005

(54) METHOD OF MANUFACTURING SEMICONDUCTOR DEVICE AND CUTTING APPARATUS FOR CUTTING SEMICONDUCTOR WAFER

(75) Inventor: Kiyoshi Arita, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 14 days.

(21) Appl. No.: 10/762,015

(22) Filed: Jan. 21, 2004

(65) Prior Publication Data

US 2005/0072766 A1 Apr. 7, 2005

(30) Foreign Application Priority Data

Jan. 23, 2003 (JP) .............................. 2003-014567

(51) Int. Cl.[7] .......................... H01L 21/46; B23K 9/00
(52) U.S. Cl. ................... 438/460; 219/121.39
(58) Field of Search ................ 438/460, 462, 438/463, 464; 219/121.39

(56) References Cited

U.S. PATENT DOCUMENTS

| 5,693,182 A | 12/1997 | Mathuni |
| 5,824,595 A | 10/1998 | Igel et al. |
| 6,013,534 A | 1/2000 | Mountain |
| 6,239,036 B1 | 5/2001 | Arita et al. |
| 6,642,127 B2 * | 11/2003 | Kumar et al. ............... 438/460 |

FOREIGN PATENT DOCUMENTS

| FR | 2 538 616 | 6/1984 |
| JP | 2002-93752 | 3/2002 |

* cited by examiner

Primary Examiner—Ha Nguyen
Assistant Examiner—Scott Geyer
(74) Attorney, Agent, or Firm—Pearne & Gordon LLP

(57) ABSTRACT

In the process of plasma dicing in which the semiconductor wafer 6 is divided into individual pieces by plasma, $SiO_2$ layer 42 and the protective layer 43, which are formed covering the active layer 41, are utilized as an etching stop layer for absorbing fluctuation of the etching rate in the first plasma dicing step in which the wafer base layer 40 is etched and cut off. Next, the second plasma dicing step is conducted in which the etching stop layer exposed by the first plasma dicing step is cut off with plasma of the second plasma generating gas capable of etching at a high etching rate, and heat damage is prevented which is caused when the protective sheet 30 is exposed to plasma for a long period of time.

10 Claims, 12 Drawing Sheets

METHOD OF MANUFACTURING SEMICONDUCTOR DEVICE AND CUTTING APPARATUS FOR CUTTING SEMICONDUCTOR WAFER

BACKGROUND OF THE INVENTION

The present invention relates to a method of manufacturing a semiconductor device for obtaining the semiconductor device by dividing a semiconductor wafer, on which a plurality of semiconductor elements are formed, into individual pieces of semiconductor elements. The present invention also relates to a cutting device of cutting the semiconductor wafer used in the manufacturing method.

A semiconductor device mounted on a board of electronic equipment is conventionally manufactured in such a manner that pins of a lead frame and metallic bumps are connected to semiconductor elements, on which a circuit pattern is formed in the state of a wafer, and the semiconductor elements are subjected to a packaging process in which they are sealed with resin. Since the size of electronic equipment has been recently reduced, the size of the semiconductor device has been also decreased. Especially, they have been actively making investigation into the reduction of the thickness of a semiconductor element.

The mechanical strength of the semiconductor element, the thickness of which is reduced, is so low that the semiconductor element is liable to break in the process of cutting conducted in the dicing step in which the semiconductor element in the state of a wafer is cut into individual pieces, and the yield of machining is inevitably lowered. Concerning the method of cutting the semiconductor element, the thickness of which is reduced, instead of the mechanical cutting method, a plasma dicing method is proposed in which the semiconductor wafer is cut when cutting grooves are formed by the etching action of plasma. Concerning this method, for example, refer to Patent Document 1.

[Patent Document 1]

Japanese Publication JP-A-2002-93752

However, in the process of plasma dicing of the prior art described above, the following problems are caused due to the want of uniformity of the plasma etching action. Further, these problems have not been solved yet. In the process of plasma etching, masking is previously conducted so that regions except for the cutting lines can be covered with a resist layer. The semiconductor wafer on which masking has been conducted is accommodated in the processing chamber of the plasma processing device, and only the regions of the cutting lines are exposed to plasma in the processing chamber so that silicon in the regions can be removed by means of etching.

In this connection, an etching rate showing the degree of etching conducted by plasma is not necessarily uniform. Therefore, the etching rate distribution fluctuates in the processing chamber. Accordingly, in the process of plasma dicing conducted in the processing chamber, silicon in the portions of the cutting lines, which are located in a range of a high etching rate, is more quickly removed than silicon in the other portions. Therefore, cutting is more quickly completed in a short period of time in these portions.

The cutting lines in these portions of the high etching rate, are successively exposed to plasma until silicon in the portions of the cutting lines located in regions of the low etching rate is removed. Accordingly, when silicon is completely removed from the regions of the high etching rate, the protective sheet on the lower face side of the semiconductor wafer is directly exposed to plasma.

When the plasma processing continues in the above state, heat generated by plasma directly acts on the protective sheet. As a result, there is a possibility that the protective sheet is overheated, burned and deformed. According to the conventional plasma dicing method, it is impossible to effectively prevent the protective sheet from being damaged by heat caused by the want of uniformity of the etching action of plasma.

SUMMARY OF THE INVENTION

Therefore, it is an object of the present invention to provide a method of manufacturing a semiconductor device capable of preventing a protective sheet from being damaged by heat when the semiconductor wafer is cut by plasma etching. It is also an object of the present invention to provide a cutting device of cutting the semiconductor wafer.

According to the invention, it is provided a method of manufacturing a semiconductor device for obtaining the semiconductor device divided into individual pieces of semiconductor elements by cutting a semiconductor wafer, the primary component of which is silicon, on the first face of which the plurality of semiconductor elements are formed, by means of plasma dicing, the method of manufacturing the semiconductor device comprising: a step of forming an etching stop layer on the first face side at positions corresponding to cutting lines which are set by dividing the semiconductor wafer into the individual pieces, the etching stop layer containing material, the etching rate of the material by plasma, in which a first plasma generating gas of mixed gas containing fluorine gas is used, being lower than an etching rate of etching silicon by plasma in which the first plasma generating gas is used; a step of attaching a protective sheet, which is capable of being peeled off, onto the first face and forming a mask for determining the cutting lines on a second face opposite to the first face; a first plasma dicing step of etching silicon from the second face side by plasma of the first plasma generating gas; and a second plasma dicing step of etching the etching stop layer, which is exposed in the first plasma dicing step, by a second plasma generating gas capable of etching at a higher etching rate than the etching rate of the first plasma generating gas.

The invention described in claim 2 provides a method of manufacturing a semiconductor device according to claim 1, wherein a ratio of the etching rate of etching silicon by plasma, in which the first plasma generating gas is used, to the etching rate of etching the etching stop layer by plasma, in which the first plasma generating gas is used, is not more than 0.6.

The invention described in claim 3 provides a method of manufacturing a semiconductor device according to claim 1, wherein the etching stop layer contains at least $SiO_2$, and the second plasma generating gas contains fluorine gas having hydrogen bonding or alternatively contains mixed gas containing fluorine gas.

The invention described in claim 4 provides a method of manufacturing a semiconductor device according to claim 3, wherein the second plasma generating gas contains mixed gas containing $CHF_3$ or $CF_4+H_2$.

The invention described in claim 5 provides a method of manufacturing a semiconductor device according to claim 1, wherein the etching stop layer contains at least SiN, and the second plasma generating gas is mixed gas containing at least fluorine gas and oxygen.

The invention described in claim 6 provides a method of manufacturing a semiconductor device according to claim 5, wherein the second plasma generating gas contains mixed gas containing $SF_6$ and $O_2$.

The invention described in claim 7 provides a method of manufacturing a semiconductor device according to claim 1, wherein the etching layer contains at least organic matter, and the second plasma generating gas contains at least oxygen.

The invention described in claim 8 provides a method of manufacturing a semiconductor device according to claim 1, wherein the etching stop layer contains at least an electric conductor used for the wiring of semiconductor elements.

The invention described in claim 9 provides a method of manufacturing a semiconductor device according to claim 8, wherein the electric conductor contains at least one of Al, Al—Si and Al—Si—Cu, and the second plasma generating gas contains at least chlorine or chlorine compound gas.

The invention described in claim 10 provides a cutting device of cutting a semiconductor wafer used for the method of manufacturing a semiconductor device described in claim 1, comprising: a processing chamber of forming a tightly closed space; an electrode having a plane tightly coming into contact with the protective sheet; a holding means for holding the semiconductor wafer by the electrode under the condition that the protective sheet is tightly contacted with the plane; a pumping means for decompressing the processing chamber; a plasma generating gas supply section of supplying plasma generating gas into the processing chamber; and a high frequency electric power supply section of impressing a high frequency voltage upon the electrode so as to transfer plasma processing gas, which is supplied into the processing chamber, into a state of plasma, wherein the plasma generating gas supply section includes a gas selecting means for selectively supplying the first plasma generating gas used in the first plasma dicing step or the second plasma generating gas for generating plasma capable of etching the etching stop layer, which is exposed by the first plasma dicing step, at a higher etching rate than the etching rate of plasma of the first plasma generating gas.

According to the present invention, an etching stop layer containing material, the etching rate of which is lower than that of etching conducted by the first plasma generating gas on silicon, is formed at positions corresponding to the cutting lines of a semiconductor wafer, and after the first plasma dicing step in which silicon is etched with plasma of the first plasma generating gas, the second plasma dicing step is executed in which the etching stop layer, which has been exposed by the first plasma dicing step, is etched with plasma of the second plasma generating gas capable of etching at a higher etching rate than the etching rate of plasma of the first plasma generating gas. Due to the foregoing, the occurrence of heat damage to a protective sheet can be prevented when the semiconductor wafer is cut by means of plasma etching.

DETAILED DESCRIPTION OF THE PREFERRED EMBODIMENTS

Embodiment 1

Figure 1:
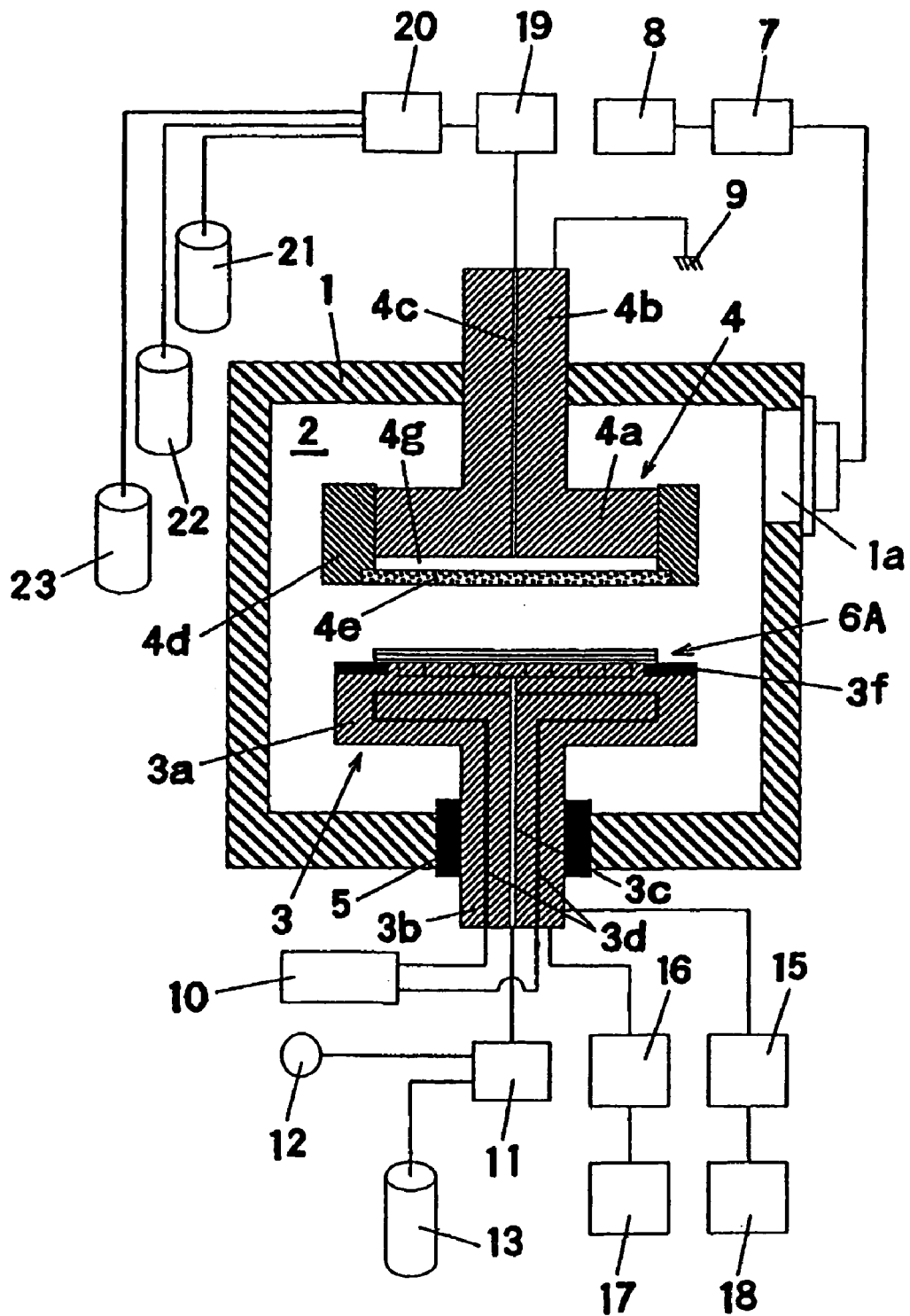
FIG. 1 is a cross sectional side view of a plasma processing device of Embodiment 1 of the present invention.
Figure 2:
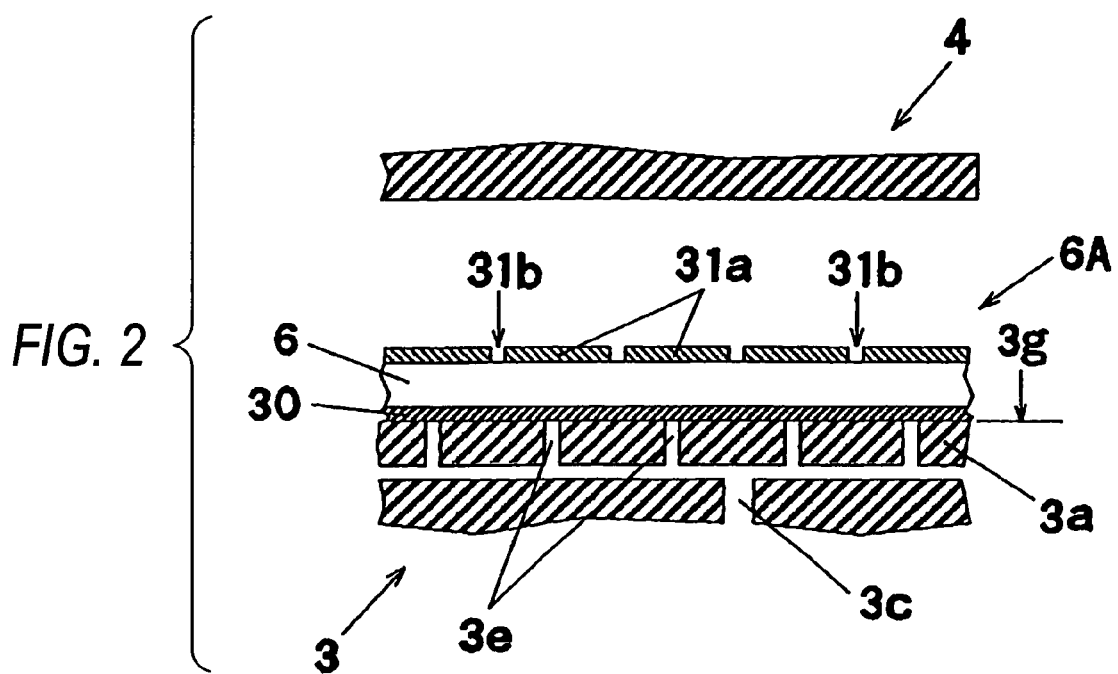
FIG. 2 is a partially cross sectional view of a lower electrode of the plasma processing device of Embodiment 1 of the present invention.
Figure 3:
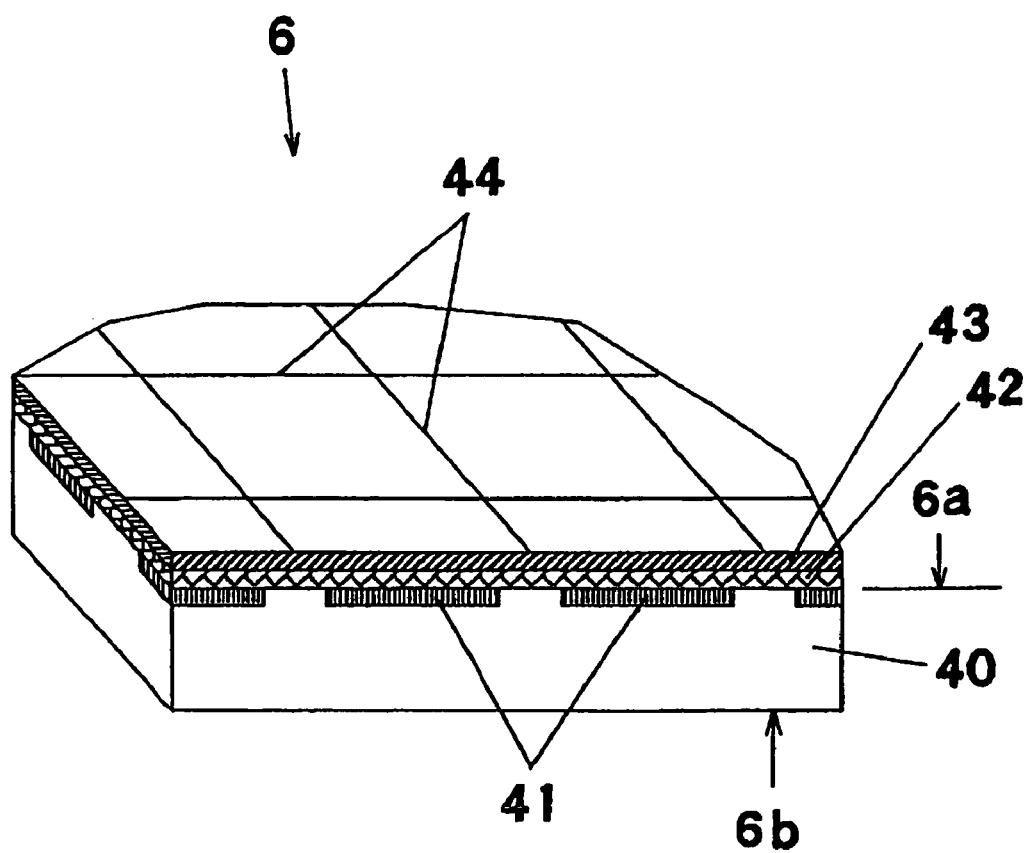
FIG. 3 is a perspective view of a semiconductor wafer of Embodiment 1 of the present invention.
Figure 4:
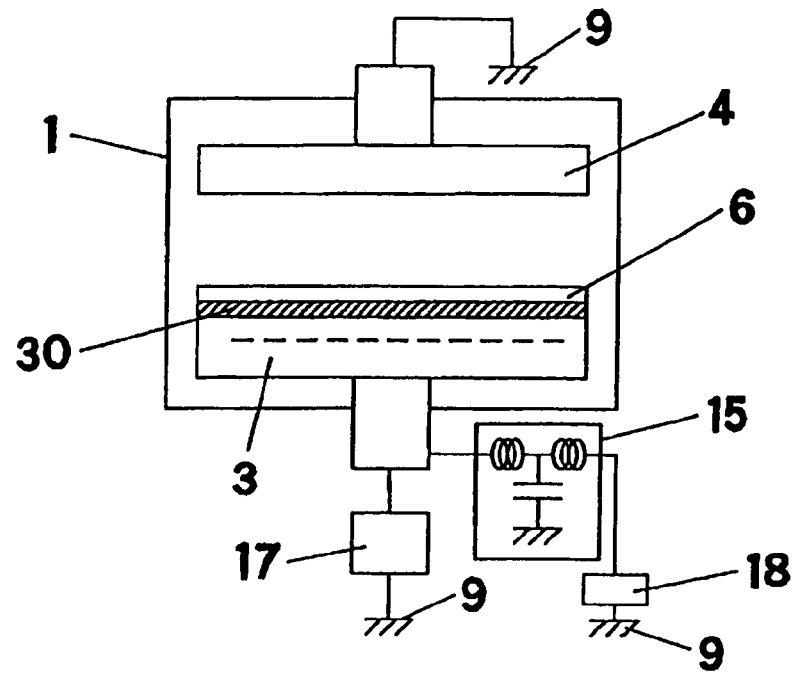
FIGS. 4(a) and 4(b) are cross sectional views of the plasma processing device of Embodiment 1 of the present invention.
Figure 4:
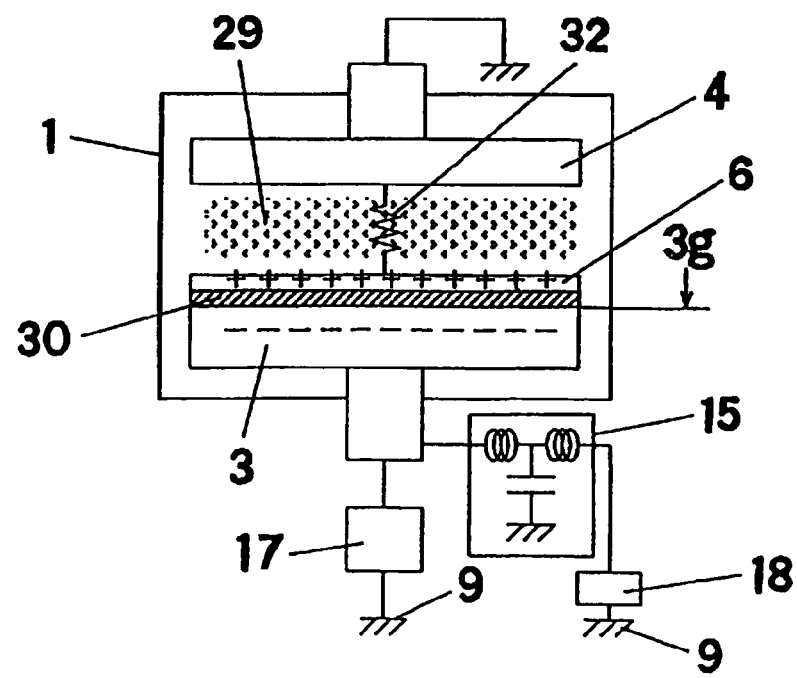
Figure 5:
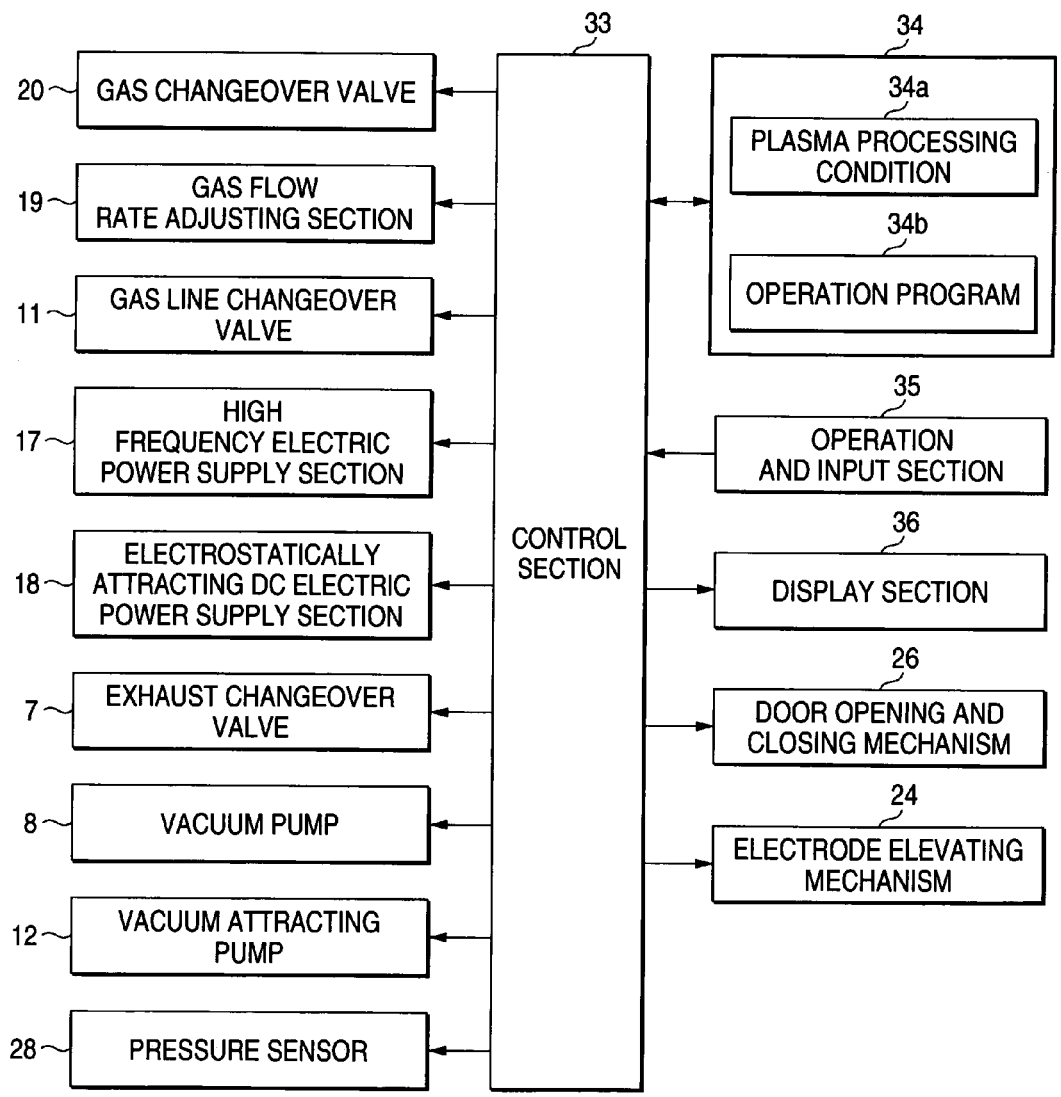
FIG. 5 is a block diagram showing a constitution of a control system of the plasma processing device of Embodiment 1 of the present invention.
Figure 6:
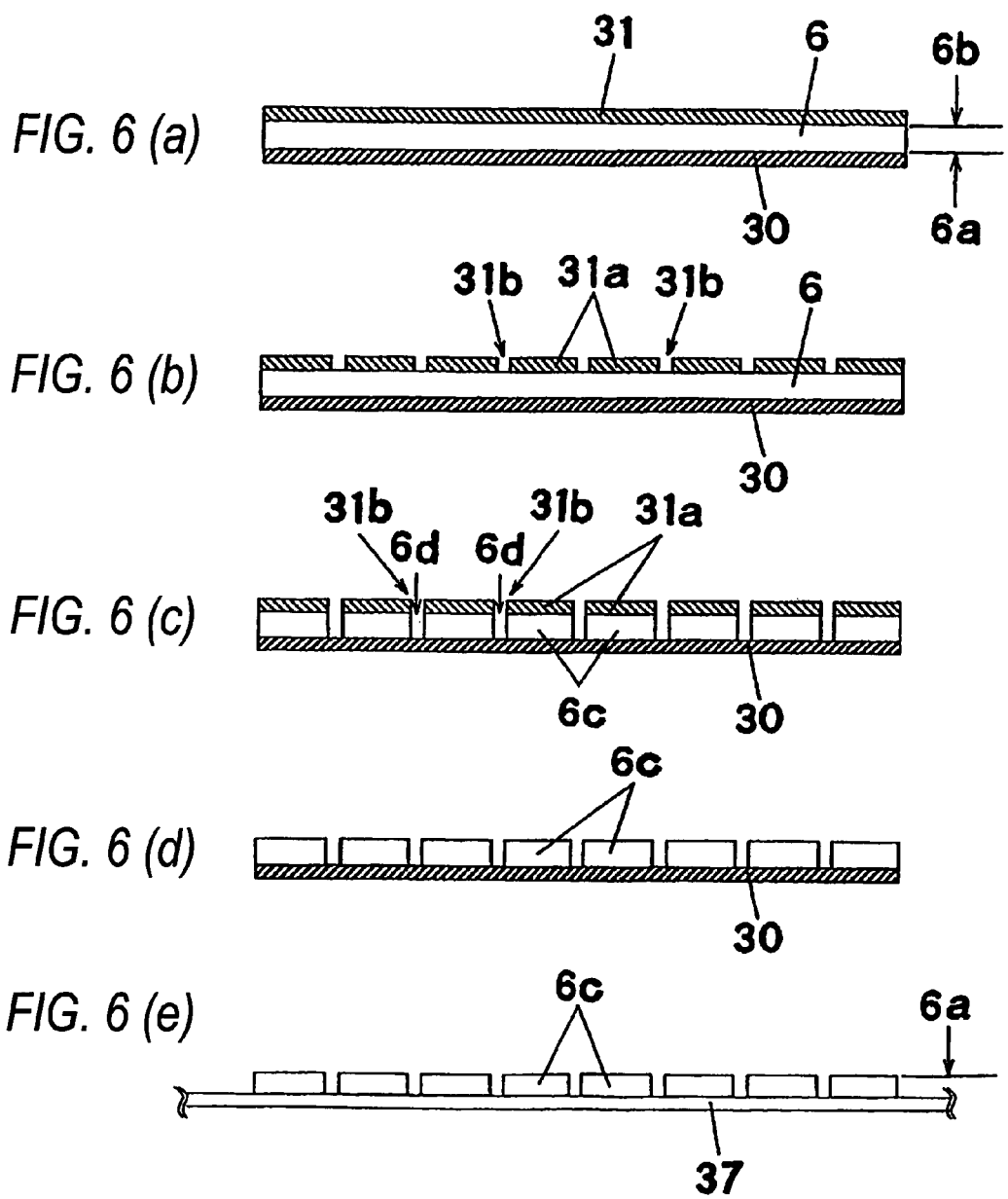
FIGS. 6(a)–6(e) are schematic illustrations for explaining a process of method of manufacturing a semiconductor device of Embodiment 1 of the present invention.
Figure 7:
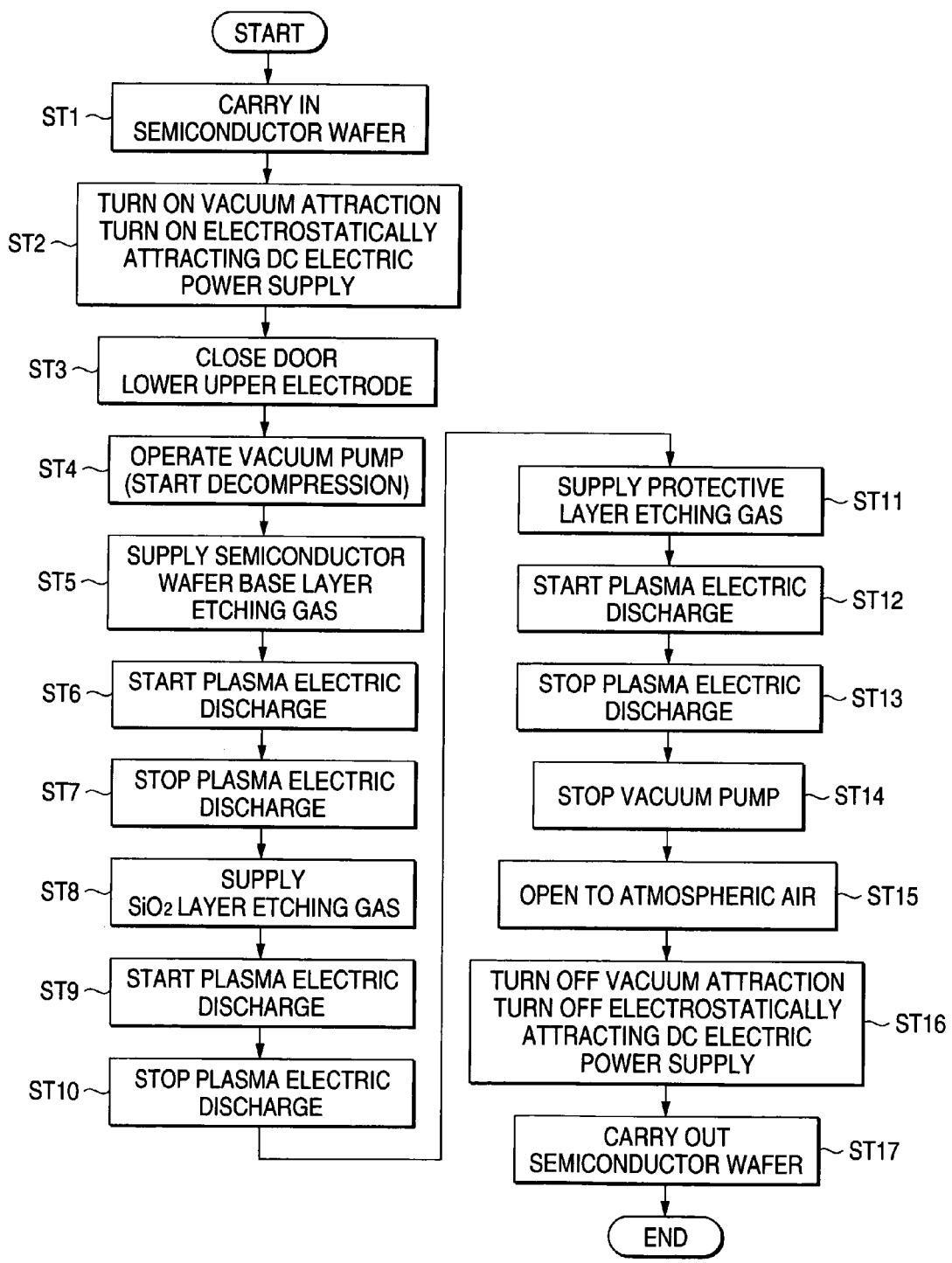
FIG. 7 is a flow chart of the plasma processing method of Embodiment 1 of the present invention.

FIG. 1 is a cross sectional side view of a plasma processing device of Embodiment 1 of the present invention, FIG. 2 is a partially cross sectional view of a lower electrode of the plasma processing device of Embodiment 1 of the present invention, FIG. 3 is a perspective view of a semiconductor wafer of Embodiment 1 of the present invention, FIGS. 4(a) and 4(b) are cross sectional views of the plasma processing device of Embodiment 1 of the present invention, FIG. 5 is a block diagram showing a constitution of a control system of the plasma processing device of Embodiment 1 of the present invention, FIGS. 6(a)–6(e) are schematic illustrations for explaining a process of method of manufacturing a semiconductor device of Embodiment 1 of the present invention, FIG. 7 is a flow chart of the plasma processing method of Embodiment 1 of the present invention, and FIGS. 8(a)–8(d) are schematic illustrations for explaining a step of plasma dicing in the method of manufacturing the semiconductor device of Embodiment 1 of the present invention.

First, referring to FIGS. 1 to 3, the plasma processing device will be explained below. This plasma processing device is used in the manufacturing process of a semiconductor device obtained in such a manner that a semiconductor wafer, on the circuit forming face (the first face) of which a plurality of semiconductor elements are formed, is divided into individual pieces of the semiconductor elements so as to obtain a semiconductor device, the thickness of which is reduced. This plasma processing device is used as a cutting device of cutting a semiconductor wafer.

In the manufacturing process of this semiconductor device, first of all, a protective sheet is attached to the circuit forming face of the semiconductor wafer. On the reverse face opposite side to the circuit forming face of the semiconductor wafer, a mask to determine cutting lines used for dividing the semiconductor wafer into individual pieces of the semiconductor elements is formed. The step of plasma dicing is conducted on the above semiconductor wafer by the present plasma processing device.

In FIG. 1, a processing chamber 2 for conducting plasma processing on the semiconductor wafer is provided inside the vacuum chamber 1. By this processing chamber 2, it is possible to form a tightly sealed space for generating plasma in the state of reduced pressure. In a lower portion inside the processing chamber 2, the lower electrode 3 is arranged. In an upper portion of the lower electrode 3, the upper electrode 4 is arranged being opposed to the lower electrode 3. The lower electrode 3 and the upper electrode 4 are respectively formed into a cylindrical shape and arranged in the processing chamber 2 concentrically with each other.

The lower electrode 3 is made of conductive material such as aluminum. The profile of the lower electrode 3 is formed in such a manner that the supporting portion 3b is extended downward from the disk-shaped electrode portion 3a. When the supporting portion 3b is held by the vacuum chamber 1 via the insulating material 5, the lower electrode 3 is attached being electrically insulated. The upper electrode 4 is made of conductive material such as aluminum in the same manner as that of the lower electrode 3. The support portion 4b is extended upward from the disk-shaped electrode portion 4a.

The support portion 4b is electrically continued to the vacuum chamber 1 and can be elevated by the electrode elevating mechanism not shown in the drawing. Under the condition that the upper electrode 4 is lowered, an electric discharge space for generating a plasma electric discharge used for plasma processing is formed between the upper electrode 4 and the lower electrode 3. The electrode elevating mechanism functions as an electrode distance changing means. When the upper electrode 4 is elevated by the electrode elevating mechanism 24, an electrode distance between the lower electrode 3 and the upper electrode 4 can be changed.

Next, explanations will be made into the structure of the lower electrode 3 and the semiconductor wafer to be processed. An upper face of the electrode portion 3a of the lower electrode 3 is a flat holding face (plane) on which the semiconductor wafer is put. An insulating coating layer 3f is provided in an outer peripheral portion of the holding face. The insulating coating layer 3f is made of ceramics such as alumina. Due to the above structure, the outer peripheral portion of the lower electrode 3 is insulated from plasma generated in the electric discharge space 2b, so that the occurrence of an abnormal electric discharge can be prevented.

FIG. 2 is a view showing a state in which the semiconductor wafer 6 before the start of plasma dicing is put on the lower electrode 3. The protective sheet 30 is attached to the surface side (on the lower face side in FIG. 2) of the semiconductor wafer 6. Under the condition that the semiconductor wafer 6 is put on the lower electrode 3, the protective sheet 30 is tightly contacted with the holding face 3g of the upper face of the electrode portion 3a. The protective sheet 30 is a resin sheet made of insulating resin such as polyolefine, polyimide or polyethylene terephthalate and formed into a film of 100 $\mu$m thickness. Under the condition that the protective sheet 30 is attached to the semiconductor wafer 6, the protective sheet 30 functions as a dielectric body when the semiconductor wafer 6 is electrostatically attracted to the holding face 3g of the electrode portion 3a.

On the reverse face 2b (the second face) on the opposite side (the upper side in FIG. 2) to the circuit forming face, a mask for determining the cutting lines in the process of plasma dicing described later is formed. This mask is formed when patterning is conducted with a resist film after the reverse face is machined as described later. Due to the foregoing, a region except for the portion of the cutting line 31b, which is an object of plasma etching, is covered with the resin film 31a. The cutting lines 31b to divide the resist film 31a are formed at positions corresponding to the positions of the dicing lines 44 shown in FIG. 3.

Then, referring to FIG. 3, the constitution of the semiconductor wafer 6 will be explained below. The semiconductor wafer 6 is mainly composed of a wafer base layer 40 made of silicon. The active layers 41 composing circuits of individual pieces of the semiconductor elements are arranged being formed into a lattice-shape on the circuit forming face 6a (the first face) of the semiconductor wafer 6. In this lattice-shaped arrangement, an interval of the active layers corresponds to the cutting width of plasma dicing.

On an upper face of each active layer 41, the SiO$_2$ layer 42 and the protective layer (the passivation layer) 43 are formed being put on each other covering the entire face of the circuit forming face 6a. The protective layer 43 is composed of a ceramic layer made of SiN. Alternatively, the protective layer 43 is composed of an organic matter layer made of polyimide. The lattice-shaped dicing lines 44 shown on the upper face of the protective layer 43 divide the semiconductor wafer 6 into individual pieces of the semiconductor elements corresponding to the active layers 41. Therefore, the lattice-shaped dicing lines 44 are set at positions corresponding to the positions to separate the active layers from each other.

In this embodiment, the SiO$_2$ layer 42 and the protective layer 43 have not only the original function but also the function of an etching stop layer in plasma dicing to cut the semiconductor wafer 6 by means of plasma etching. As explained below, the etching stop layer has a function of preventing the occurrence of problems caused by the fluctuation of the etching rate distribution in the processing chamber 2.

In the case of plasma dicing shown in this embodiment, plasma etching is conducted on the entire face of the semiconductor wafer 6, so that the semiconductor wafer 6 can be divided into individual pieces of the semiconductor elements all at once. Due to the want of uniformity of the etching rate distribution, etching does not necessarily uniformly proceed on the entire face of the semiconductor wafer 6 in the process of plasma dicing. Therefore, etching fluctuates according to the positions on the semiconductor wafer 6.

In the range of a high etching rate, even after etching of the wafer base layer 40 of the semiconductor 6 has been completed, this range is successively subjected to the action of plasma until etching of the other range is completed in the same manner. Therefore, plasma acts even on the protective sheet 30 attached to the semiconductor wafer 6, which causes problems. In order to solve the problems, the etching stop layer functions as a buffer layer to absorb the progress of the etching action.

A layer (an etching stop layer) for delaying the progress of plasma etching, which is conducted on silicon by using plasma generating gas, is interposed between the base layer 40, which is the main object of cutting in plasma dicing, and the protective sheet 30. Due to the existence of the etching stop layer, damage caused on the protective sheet 30 is suppressed to the minimum. In this embodiment, the $SiO_2$ layer 42, which is originally provided on the semiconductor wafer 6, and the protective layer 43 are used as this etching stop layer.

As shown in FIG. 2, a plurality of attracting holes 3e which are open to the holding face 3g are provided in the lower electrode 3, and these attracting holes 3e are communicated with the suction holes 3c provided in the lower electrode 3. As shown in FIG. 1, the suction holes 3c are connected to the vacuum suction pump 12 via the gas line changeover valve 11. The gas line changeover valve 11 is connected to the $N_2$ gas supply section 13 for supplying nitrogen gas. When gas line changeover valve 11 is changed over, the suction holes 3c can be connected being selectively changed over between the vacuum suction pump 12 and the $N_2$ gas supply section 13.

When the vacuum pump 12 is driven under the condition that the suction holes 3c are communicated with the vacuum suction pump 12, vacuum suction is conducted from the attracting holes 3e, and the semiconductor wafer 6, which is put on the lower electrode 3, is attracted by vacuum and held. Accordingly, the attracting holes 3e, the suction holes 3c and the vacuum suction pump 12 compose the attracting and holding means for holding the semiconductor wafer 6 under the condition that the protective sheet 30 is tightly contacted with the holding face 3g of the electrode portion 3a when vacuum suction is conducted from the attracting holes 3e which are open to the holding face 3g of the lower electrode 3.

When the suction holes 3c are connected to the $N_2$ gas supply section 13, $N_2$ gas can be blown out from the attracting holes 3e to the lower face of the protective sheet 30. As described later, this $N_2$ gas, which is blown out from the attracting holes 3e to the lower face of the protective sheet 30, is blown out for the object of forcibly detaching the protective sheet 30 from the holding face 3g.

There is provided a coolant flow passage 3d in which coolant used for cooling flows in the lower electrode 3. The coolant flow passage 3d is connected to the cooling mechanism 10. When the cooling mechanism 10 is driven, coolant such as cooling water circulates in the coolant flow passage 3d. Therefore, the lower electrode 3 and the protective sheet 30 on the lower electrode 3, the temperatures of which are raised by heat generated in the process of plasma processing, are cooled by the circulating coolant. The coolant flow passage 3d and the cooling mechanism 10 compose the cooling means for cooling the lower electrode 3.

The exhaust port 1a, which is communicated with the processing chamber 2, is connected to the vacuum pump 8 via the exhaust changeover valve 7. When the exhaust changeover valve 7 is changed over and the vacuum pump 8 is driven, the inside of the processing chamber 2 of the vacuum chamber 1 is exhausted by vacuum, so that the pressure in the processing chamber 2 can be reduced. The processing chamber 2 is provided with a pressure sensor (not shown) which is omitted in the drawing. When the control section controls the vacuum pump 8 according to the result of measuring the pressure by this pressure sensor, the pressure in the processing chamber 2 can be reduced to a desired value. The vacuum pump 8 composes a pressure reducing means for reducing the pressure in the processing chamber 2 to a desired value. When the exhaust change over valve 7 is changed over to the atmospheric air side, the atmosphere is introduced into the processing chamber 2, and the pressure in the processing chamber 2 can be returned to the atmospheric pressure.

Next, the upper electrodes 4 will be explained in detail. The upper electrodes 4 includes: a central electrode 4a; and an extending portion 4f made of insulating material which surrounds the electrode portion 4a and extends to the outer circumferential portion of the central electrode 4a. The profile of the extending portion 4f is larger than that of the lower electrode 3 and arranged being extended outside the lower electrode 3. The gas blowing portion 4e is provided at the central portion on the lower face of the upper electrode 4.

The gas blowing portion 4e supplies gas for generating plasma which is used for generating plasma electric discharge in the electric discharge space formed between the upper electrode 4 and the lower electrode 3. The gas blowing portion 4e is a circular plate member made of porous material having a large number of minute holes in it. Gas for generating plasma is uniformly blown out from the gas staying space 4g into the electric discharge space via the minute holes so that gas can be uniformly supplied. In the support portion 4b, the gas supply hole 4c communicating with the gas staying space 4g is provided. The gas supply hole 4c is connected to the plasma generating gas supply section described below via the gas flow rate adjusting section 19.

The plasma generating gas supply section is composed of a gas changeover valve 20, wafer base layer etching gas supply section 21, $SiO_2$ layer etching gas supply section 22 and protective layer etching gas supply section 23. One of the plurality of types of plasma generating gasses, which are used for plasma dicing, is selected being changed over by the gas changeover valve 20, which is a gas selecting means, and supplied from the plasma generating gas supply section into the electric discharge space.

In the above plasma generating gas supply system, when the gas flow rate adjusting section 19 is controlled according to a command sent from the control section 33, a flow rate of gas supplied into the electric discharge space can be arbitrarily adjusted. Due to the foregoing, pressure in the processing chamber 2, into which plasma generating gas is supplied, is controlled according to the plasma processing condition, which has been previously set, and according to the pressure in the processing chamber 2 detected by the pressure sensor. Accordingly, the gas flow rate adjusting section 19 composes the pressure control means for controlling the pressure in the processing chamber 2.

In the case of etching the wafer base layer made of silicon, the wafer base layer etching gas supply section 21 supplies mixed gas containing fluorine gas such as mixed gas, in which sulfur hexafluoride ($SF_6$) or carbon tetrafluoride ($CF_4$) is mixed with helium, as plasma generating gas. The wafer base layer etching gas supply section 21 is the first plasma generating gas supply section for supplying the first plasma generating gas which is mixed gas containing fluorine gas.

In the case of etching the $SiO_2$ layer, the $SiO_2$ layer etching gas supply section 22 supplies fluorine gas (for example, $CHF_3$) having hydrogen bonding or mixed gas (for example, $CF_4+H_2$) containing fluorine gas and hydrogen as plasma generating gas. In the case of etching an organic matter layer such as a polyimide layer, the protective layer etching gas supply section 23 supplies mixed gas containing oxygen as plasma generating gas. In the case of using the SiN layer as the protective layer 43, mixed gas (for example, $CF4+O_2$) containing fluorine gas and oxygen is supplied as plasma generating gas. The above gases have a characteristic in which the objective material can be highly effectively etched.

In this case, the etching rate will be explained as follows. As described above, in order for the etching stop layer to function so as to stop the progress of etching, it is required that the etching rate is low in the case where etching is conducted on silicon with plasma of mixed gas (the first plasma generating gas) containing fluorine gas. Therefore, in order to judge whether or not the material is appropriate to fulfill the function as the etching stop layer, the etching rate is defined for judging whether or not the material is appropriate.

Etching rate ratio R is defined as the ratio ($r/r_0$) of the etching rate $r_0$ in the case of conducting etching on silicon, which is the reference material, with plasma of the first plasma generating gas to the etching rate r in the case of conducting etching on the etching stop layer with plasma of the first plasma generating gas. In other words, etching rate ratio represents an etching rate in the case of conducting etching on a material with plasma of plasma generating gas when an etching rate is determined to be 1 in the case of conducting etching on silicon, which is the reference material, with plasma of the same plasma generating gas.

For example, when the etching rate ratio R is 1, it shows that the same etching effect as that of silicon is provided in the case where etching is conducted with plasma of the first plasma generating gas. When etching rate ratio R is 0.1, it shows that etching is conducted only by 0.1 time of silicon. In this case, when etching rate ratio R is not more than 0.6, it is judged that the material can be used for the etching stop layer.

In the cases of actual materials shown in this embodiment, etching rate ratios R of $SiO_2$, SiN and polyimide are respectively 0.1, 0.05 and 0.6 according to the result of an actual measurement. In other words, it is difficult for these materials to be etched with plasma of the first plasma generating gas. Therefore, it is judged that both the $SiO_2$ layer 42 and the protective layer 43 (SiN or polyimide) of the semiconductor wafer 6 are appropriate for the etching stop layer.

As described above, in the case of setting the etching stop layer, materials are selected which are difficult to be etched with plasma of the first plasma generating gas containing mixed gas of fluorine. However, in the case of conducting plasma dicing, it is necessary to effectively cut the entire semiconductor wafer 6 including not only the base layer 40 but also the etching stop layer. Therefore, in the plasma processing device of this embodiment, an appropriate type gas, which is appropriately used for conducting etching on the etching stop layer, is selected to be the second plasma generating gas, and the plasma generating gas is changed over from the first plasma generating gas to the second plasma generating gas in the process of plasma dicing.

Fluorine gas (for example, $CHF_3$) having hydrogen bonding, which is supplied by the $SiO_2$ layer etching gas supply section 22, mixed gas (for example, $CF_4+H_2$) containing fluorine gas and hydrogen, mixed gas containing oxygen supplied by the protective layer etching gas supply section 23 and mixed gas (for example, $CF_4+O_2$) containing fluorine gas and oxygen are the second plasma generating gases capable of conducting etching on the etching stop layer at a higher etching rate than the etching rate of conducting etching on the etching stop layer with plasma of the first plasma generating gas. The $SiO_2$ layer etching gas supply section 22 and the protective layer etching gas supply section 23 are the second plasma generating gas supply means.

In this case, explanations will be made into an appropriate thickness of the etching stop layer. The appropriate thickness of the etching stop layer is determined by necessary thickness X which is required at the minimum for fulfilling the buffer function to absorb the fluctuation of the degree of progress of etching caused by the want of uniformity of the etching rate distribution. Necessary thickness X is found by the following calculation formula.

$$X = Y \times 2Z/100 \times R \tag{Formula 1}$$

where Y is the thickness of the wafer base layer 40 of the semiconductor wafer 6, Z is the fluctuation (%) of the etching rate distribution, and R is the etching rate ratio. In this case, fluctuation Z of the etching rate is an index of showing the degree of fluctuation of the etching rate on the semiconductor wafer 6 in the case of conducting plasma etching on the semiconductor wafer 6. For example, when fluctuation Z is ±10%, a difference is caused by 20% at the maximum in the degree of progress of etching.

Value X found by Formula 1 corresponds to the thickness of the etching stop layer capable of absorbing the difference of the degree of progress of etching caused by fluctuation Z at the point of time of completion of etching. Value X corresponds to the thickness at the point of time when etching of the wafer base layer 40 has been completed at the position where the etching rate is lowest. Value X corresponds to the thickness at the point of time when etching of the etching stop layer has been completed at the position where the etching rate is highest.

For example, when a single layer of $SiO_2$, the etching distribution of which is ±10, the wafer thickness Y of which is 50 $\mu$m, the etching rate ratio of which is 0.1, is used as the etching stop layer, the necessary thickness X of the etching stop layer is given to be 1 $\mu$m by Equation 1. That is, when the etching stop layer of this thickness is provided, at the position where the etching rate is lowest and at the time when the etching of the wafer base layer has been completed, not only the wafer base layer but also the etching stop layer has been completely etched at the position where the etching rate is highest.

In FIG. 1, the lower electrode 3 is electrically connected to the high frequency electric power supply section 17 via the matching circuit 16. When the high frequency electric power supply section 17 is driven, a high frequency voltage is impressed between the upper electrode 4, which is electrically continued to the vacuum chamber 1 grounded to the grounding section 9, and the lower electrode 3. Due to the foregoing, plasma electric discharge is generated in the electric discharge space between the upper electrode 4 and the lower electrode 3. Accordingly, the plasma generating gas supplied to the processing chamber 2 is transferred into the state of plasma. The matching circuit 16 conducts impedance matching between the plasma electric discharge circuit in the processing chamber 2 and the high frequency electric power supply section 17 at the time of generating this plasma.

The lower electrode 3 is connected to the electrostatically attracting DC electric power supply section 18 via RF filter 15. When the electrostatically attracting DC electric power supply section 18 is driven, as shown in FIG. 4(a), negative electric charges are accumulated on the surface of the lower electrode 3. When plasma is generated in the processing chamber 2 by driving the high frequency electric power supply section 17 as shown by the dotted portion 29 in FIG. 4(*b*), the DC current impressing circuit 32 for connecting the semiconductor wafer 6, which is put on the holding face 3*g* via the protective sheet 30, to the grounding section 9 is formed in the processing chamber 2 via the plasma. Due to the foregoing, a closed circuit is formed in which the lower electrode 3, RF filter 15, the electrostatically attracting DC electric power supply section 18, the grounding section 9, the plasma and the semiconductor wafer 6 are successively connected in this order, and positive electric charges are accumulated on the semiconductor wafer 6.

Coulomb's force acts between the negative electric charges, which are accumulated on the holding face 3*g* of the lower electrode 3 made of conductive material, and the positive electric charges which are accumulated on the semiconductor wafer 6 via the protective sheet 30 including an insulating layer as dielectrics. By this Coulomb's force, the semiconductor wafer 6 is held by the lower electrode 3. At this time, RF filter 15 prevents the high frequency voltage of the high frequency electric power supply section 17 from being directly given to the electrostatically attracting DC electric power supply section 18. In this connection, the polarity of the electrostatically attracting DC electric power supply section 18 may be reversed.

In the above constitution, the electrostatically attracting DC electric power supply section 18 composes the DC voltage impressing means for electrostatically attracting the semiconductor wafer 6 by utilizing Coulomb's force acting between the semiconductor wafer 6 and the holding face 3*g* of the lower electrode 3, which are separate from each other by the protective sheet 30, when DC voltage is impressed upon the lower electrode 3. That is, concerning the holding means for holding the semiconductor wafer 6 on the lower electrode 3, the vacuum attracting means for attracting the protective sheet 30 via the plurality of attracting holes 3*e*, which are open to the holding face 3*g*, by vacuum and the DC voltage impressing means described above are provided, and these two types of means are properly used.

An opening portion (not shown) used for carrying in and out an object to be processed is provided on the side of the processing chamber 2 in such a manner the opening portion can be freely opened and closed. In the case of carrying in and out the semiconductor wafer 6, the upper electrode 4 is raised by the electrode elevating mechanism so that a space used for carrying can be ensured on the lower electrode 3, and then the semiconductor wafer 6 is carried in and out by the wafer conveyance mechanism via the opening portion.

Next, referring to FIG. 5, explanations will be made into the constitution of the control system of the plasma processing device. In FIG. 5, the control section 33 is connected to the storage section 34 for storing various data and processing programs. The storage section 34 stores the plasma processing condition 34*a* and the plasma processing operation program 34*b*. The operation inputting section 35 is an inputting means such as a key board and inputs data such as a plasma processing condition and an operation command. The display section 36 is a display device which displays a guiding image plane in the case of inputting for operation.

In the plasma processing operation carried out according to the operation program 34*b*, the control section 33 controls the gas changeover valve 20, gas flow rate adjusting section 19, gas line changeover valve 11, high frequency electric power supply section 17, electrostatically attracting DC electric power supply section 18, exhaust changeover valve 7, vacuum pump 8, vacuum attracting pump 12, door opening and closing mechanism 26 and electrode elevating mechanism 24. At this time, the type of gas and pressure are set when the control section 33 controls the gas changeover valve 22 and the gas flow rate adjusting section 19 according to the pressure detection result of the pressure sensor 28 and the above plasma processing condition 34*a*.

The plasma processing device is composed as described above. Referring to FIGS. 6(*a*)–6(*e*) and the other drawings, explanations will be made into the method of manufacturing the semiconductor device, in which the above plasma processing device is used, and the plasma processing method carried out in the process of the method of manufacturing this semiconductor device.

First, as shown in FIG. 6(*a*), reference numeral 6 is a semiconductor wafer, on which a plurality of semiconductor elements are formed, the thickness of which is reduced by means of machining. The thickness of the semiconductor wafer is reduced to a value not more than 100 μm in the thickness reducing step previously conducted. Before the thickness reducing step, the $SiO_2$ layer 42 and the protective layer 43, which are shown in FIG. 3, are previously formed as the etching stop layer on the circuit forming face 6*a* of the semiconductor wafer 6. These $SiO_2$ layer 42 and protective layer 43 cover the entire face of the semiconductor wafer 6 including the positions corresponding to the cutting lines which are set so that the semiconductor wafer 6 can be divided into individual pieces. The $SiO_2$ layer 42 and the protective layer 43 contain material, the etching rate of plasma of the first plasma generating gas of which is lower than the etching rate of plasma of the first plasma generating gas of etching silicon.

As shown in FIG. 6(*a*), before the step of reducing the thickness is conducted, the protective sheet 30 is attached to the circuit forming face (the first face) of the semiconductor wafer 6 (sheet attaching process). In this case, the profile of the protective sheet 30 is the same as that of the semiconductor wafer 6 so that the protective sheet 30 can cover the overall circuit forming face 6*a* and can not protrude outside the semiconductor wafer 6. Due to the foregoing, the protective sheet 30 is not exposed to plasma in the plasma processing conducted later. Therefore, it is possible to prevent the protective sheet 30 from being damaged by plasma.

After the completion of the thickness reducing step, the resist film 31 is formed on the reverse face 6*b* (the second face) of the circuit forming face 6*a* of the semiconductor wafer in such a manner that the resist film 31 covers the entire face of the semiconductor wafer 6. This resist film 31 is used for forming a mask to determine the cutting lines for dividing the semiconductor wafer 6 into individual pieces of the semiconductor elements. Patterning is conducted on the resist film 31 by means of photolithography so as to remove portions of the resist film 31 corresponding to the cutting lines 31*b*. Due to the foregoing, as shown in FIG. 6(*b*), on the reverse face of the semiconductor wafer 6, the mask is formed, the region except for the portions of the cutting lines 31*b* of which is covered with the resist film 31*a*. The semiconductor wafer 6 having the mask in this state becomes an object to be processed by means of plasma processing.

Figure 8:
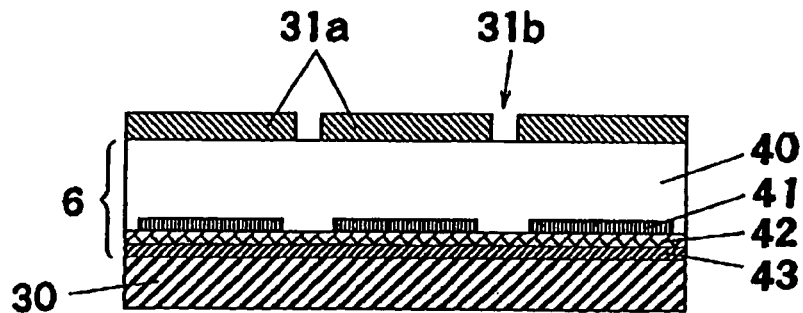
FIGS. 8(a)–8(d) are schematic illustrations for explaining a step of plasma dicing in the method of manufacturing the semiconductor device of Embodiment 1 of the present invention.
Figure 8:
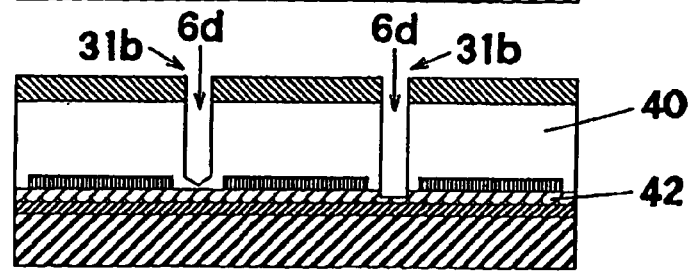
Figure 8:
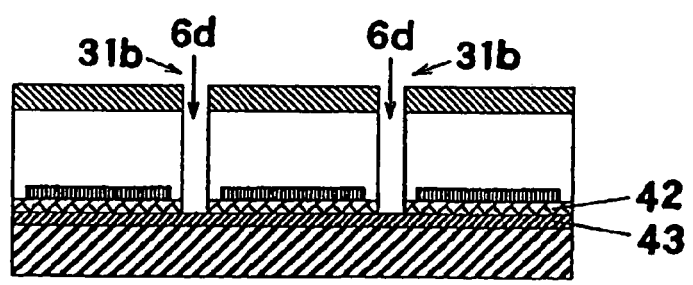
Figure 8:
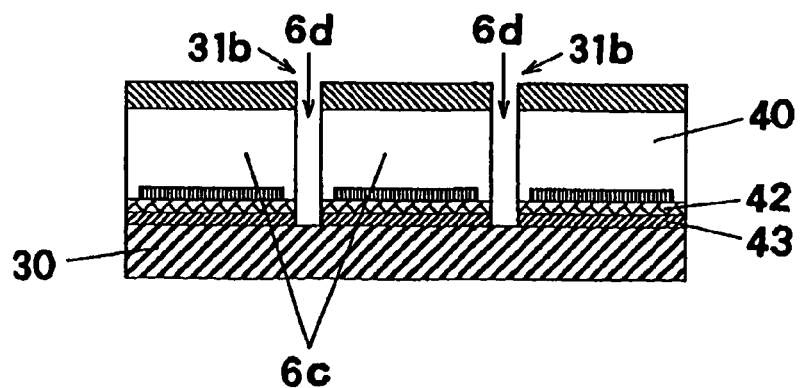

Referring to the flow chart shown in FIGS. 7 and 8, the plasma processing method, the object to be processed of which is this semiconductor wafer 6 having the mask, will be explained below. First, the semiconductor wafer 6 having the mask is conveyed into the processing chamber 2 (ST1). Next, the vacuum attracting pump 12 is driven so as to attract from the attracting holes 3*e* by vacuum, and the vacuum attraction of the semiconductor wafer 6 is turned on and the electrostatically attracting DC electric power supply section 18 is turned on (ST2). By this vacuum attraction, the semiconductor wafer 6 is held by the lower electrode 3 while the protective sheet 30 is being tightly contacted with the holding face 3g of the lower electrode 3. FIG. 8(a) is a view showing the semiconductor wafer 6 in this state in which the protective sheet 30 is attached to a surface of the protective layer 43 on the circuit forming face 6a side of the semiconductor wafer 6.

After that, the door of the processing chamber 2 is closed, and the upper electrode 4 is lowered (ST3). Due to the foregoing, the electrode distance between the upper electrode 4 and the lower electrode 3 is set at an electrode distance shown in the plasma processing condition. Next, the vacuum pump 8 is set in motion, and decompression of the processing chamber 2 is started (ST4). When the pressure in the processing chamber 2 has reached a predetermined degree of vacuum, the semiconductor wafer base layer etching gas made of mixed gas, in which sulfur hexafluoride and helium are mixed, is supplied from the first plasma generating gas supply section 21 (ST5).

When the pressure in the processing chamber 2 has reached the gas pressure shown in the plasma processing condition, the high frequency electric power supply 18 is driven, and a high frequency voltage is impressed between the upper electrode 4 and the lower electrode 3 so as to start plasma electric discharge (ST6). Due to the foregoing, the wafer base layer gas containing fluorine gas such as sulfur hexafluoride is transferred into a state of plasma in the electric discharge space formed between the upper electrode 4 and the lower electrode 3.

By the generation of plasma, the semiconductor wafer 6 is exposed to the plasma of fluorine gas from the second face side (the reverse face side). By this irradiation of plasma, only the portions of silicon of primary material of the semiconductor wafer 6, which are the portions of the cutting lines 31b not covered with the resist film 31a, are plasma-etched by plasma of fluorine gas. According to the progress of this plasma etching, the cutting grooves 6d are formed only in the portions of the cutting lines 31b on the wafer base layer 40 as shown in FIG. 8(b).

At the same time, DC electric current impression circuit is formed in the electric discharge space between the upper electrode 4 and the lower electrode 3 as shown in FIG. 3. Due to the foregoing, an electrostatically attracting force is generated between the lower electrode 3 and the semiconductor wafer 6, so that the semiconductor wafer 6 is held on the lower electrode 3 by the electrostatically attracting force. Therefore, the protective sheet 30 is tightly contacted with the holding face 3g of the lower electrode 3. Accordingly, the semiconductor wafer 6 can be stably held in the process of plasma processing. At the same time, the protective sheet 30 can be cooled by the cooling function provided by the lower electrode 3, so that the occurrence of heat damage generated by plasma electric discharge can be prevented.

When plasma dicing is started as described above and the portions of the cutting lines 31b exposed to plasma are etched by plasma, the cutting grooves 6d are formed inward the semiconductor wafer 6. FIG. 8(b) is a view showing a state in which the plasma processing time has passed and the formation of the cutting grooves 6d has proceeded. At this time, due to the want of uniformity of the etching rate distribution in the processing chamber 2, the progress of plasma etching fluctuates according to the cutting grooves 31b.

For example, in FIG. 8(b), at the position of the right cutting line 31b located in the range of a high etching rate, the entire thickness of the wafer base layer 40 has already been cut off and the cutting groove 6d is further formed downward to the lower portion of the wafer base layer 40. Furthermore, plasma etching has proceeded to $SiO_2$ layer 42. On the other hand, at the position of the left cutting line 31b located in the range of a low etching rate, the cutting groove 6d has not yet reached the lower face of the wafer base layer 40, that is, the cutting has not yet been completed.

When plasma etching is successively conducted on the two cutting lines 31b in the state shown in FIG. 8(b), since the etching rate of plasma of the wafer base layer gas, which is fluorine gas, with respect to $SiO_2$ layer 42 is low, the progress of cutting of $SiO_2$ layer 42 by the cutting groove 6d on the right cutting line 31b is slower than the progress of cutting of the wafer base layer 40 by the cutting groove 6d on the left cutting line 31b. Accordingly, there is no possibility that $SiO_2$ layer 42 is cut off at the position, at which the etching rate is high, before the wafer base layer 40 is completely cut off on the cutting line 31b located in the range of the low etching rate. After plasma dicing of the wafer base layer 40 has been completed as described above, plasma electric discharge is stopped (ST7).

Then, $SiO_2$ layer etching gas is supplied (ST8). Next, plasma electric discharge is started (ST9), and plasma etching is conducted on $SiO_2$ layer 42. Due to the foregoing, as shown in FIG. 6(c), the cutting grooves 6d penetrate $SiO_2$ layer 42 on the right and left cutting lines 31b, and reach the boundary line between $SiO_2$ layer 42 and the protective layer 43. After plasma dicing of $SiO_2$ layer 42 has been completed, plasma electric discharge is stopped (ST7).

Then, protective layer etching gas is supplied (ST8) Next, plasma etching is started (ST9), and the protective layer 43 is subjected to plasma etching. After the plasma etching of the protective layer 43 has been completed, plasma electric discharge is stopped (ST13). As shown in FIG. 8(d), when the cutting grooves 6d penetrate the wafer base layer 40, $SiO_2$ layer 42 and the protective layer 43 and reach the entire thickness of the semiconductor wafer 6, the semiconductor wafer 6 is divided into individual pieces of the semiconductor elements 6c as shown in FIG. 6(c).

The aforementioned plasma dicing includes: a first plasma dicing step in which silicon is etched from the second face side with the first plasma generating gas; and a second plasma dicing step in which the etching stop layer, which is exposed by the first plasma dicing step, is etched by the second plasma generating gas capable of conducting etching on the etching stop layer with plasma at a higher etching rate than the etching rate of the first plasma generating gas.

In this process of plasma dicing, $SiO_2$ layer 42, which is an etching stop layer, and the protective layer 43 are interposed between the wafer base layer 40 and the protective sheet 30. Therefore, the following effects can be provided.

First, in the first plasma dicing step in which plasma dicing is conducted on silicon of the wafer base layer 40, until the etching of silicon has been completed in the range of a low etching rate, the etching stop layer suppresses the progress of plasma etching in the range of a high etching rate. Until the etching of silicon has been completed in the range of the low etching rate, plasma does not directly act on the protective sheet 30.

In the second plasma etching step conducted on the etching stop layer, since the etching stop layer is originally a thin layer and plasma generating gas capable of realizing a high etching rate is selected according to the composition of the etching stop layer, etching is quickly completed in a short period of time. Therefore, after the etching stop layer has been completely removed in the range of the high etching rate, etching is successively conducted in the range of the low etching rate. As a result, the protective sheet is directly exposed to plasma for a very short period of time.

Accordingly, the aforementioned problem caused by the want of uniformity of the etching rate is not caused, that is, the problem, in which the protective sheet 30 is directly exposed to plasma and overheated in the process of plasma etching, is not caused, and plasma dicing can be accomplished in a good condition.

After that, operation of the vacuum pump 8 is stopped (ST14), and the exhaust changeover valve 7 is changed over so as to open to the atmospheric air (ST15). Due to the foregoing, the pressure in the processing chamber is returned to the atmospheric pressure. Then, the state of vacuum attraction is turned off, and the electrostatically attracting DC electric power supply 18 is turned off (ST16). Due to the foregoing, the semiconductor wafer 6, which is divided into individual pieces of the semiconductor elements and attracted and held on the protective tape 30, can be released.

After that, the semiconductor wafer 6, the plasma processing of which has been completed, is conveyed out (ST17). While nitrogen gas is being blown from the attracting holes 3e, the semiconductor wafer 6 is attracted and held by the attracting head 27 and conveyed outside the processing chamber 2. In this plasma processing, the protective sheet 30 is entirely covered with the semiconductor wafer 6 as described before. Therefore, the protective sheet 30 is not exposed to plasma. Accordingly, no damage is caused on the protective sheet 30, that is, no thermal deformation is caused on the protective sheet 30. Accordingly, the protective sheet 30 always comes into close contact with the holding face 3g and the semiconductor wafer 6, and fulfills the function of the protective sheet.

The semiconductor wafer 6 carried out together with the protective sheet 30 is sent to the mask removing step, and the resist film 31a is removed from individual pieces of the semiconductor elements 6c as shown in FIG. 6(d). After that, the semiconductor wafer 6 is sent to the sheet peeling step, and the protective sheet 30 is peeled off from the circuit forming face 6a of the semiconductor device obtained by dividing the semiconductor wafer 6 into individual pieces of the semiconductor elements 6c (the sheet peeling step). As shown in FIG. 6(e), the protective sheet 30 is peeled off after the adhesive sheet 37 for holding is attached onto the reverse face of the semiconductor element 6c and each semiconductor element 6c is held on the adhesive sheet 37.

As explained above, in the process of plasma dicing of the semiconductor wafer 6 of this embodiment, $SiO_2$ layer 42 and the protective layer 43, which are formed being put on each other on the circuit forming face, are utilized as an etching stop layer for suppressing the progress of etching. Due to the foregoing, in the first plasma dicing step in which plasma dicing is conducted on silicon of the wafer base layer 40, the etching stop layer functions as a buffer layer for reducing a difference between the degrees of the progress of etching caused by the fluctuation of the etching rate distribution.

In the second plasma etching step in which plasma etching is conducted on $SiO_2$ layer 42, which is an etching stop layer, and the protective layer 43, since $SiO_2$ layer 42 and the protective layer 43 are originally thin layers and further plasma generating gas capable of realizing a high etching rate is selected, etching can be quickly completed in a short period of time and the protective sheet 30 is directly exposed to plasma only for a very short period of time.

Due to the foregoing, heat damage to the protective sheet, which is caused by the want of uniformity of the etching rate, which is a problem not solved in the process of conventional plasma dicing, can be suppressed to the minimum, that is, heat damage to the protective sheet can be suppressed to the minimum, which is caused in such a manner that etching is conducted in the range of a high etching rate and even after silicon of the semiconductor wafer has been etched, the etching is successively conducted, so that the protective sheet on the lower face side of the semiconductor wafer is directly exposed to plasma.

Embodiment 2

Figure 9:
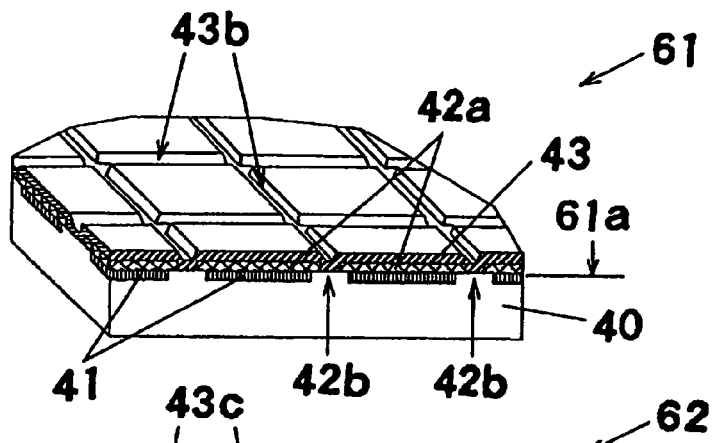
FIGS. 9(a)–9(c) are perspective views of a semiconductor wafer of Embodiment 2 of the present invention.
Figure 9:
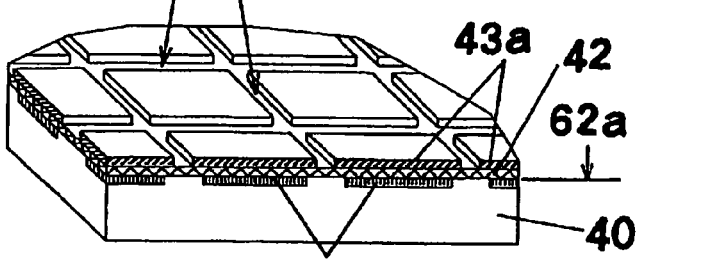
Figure 9:
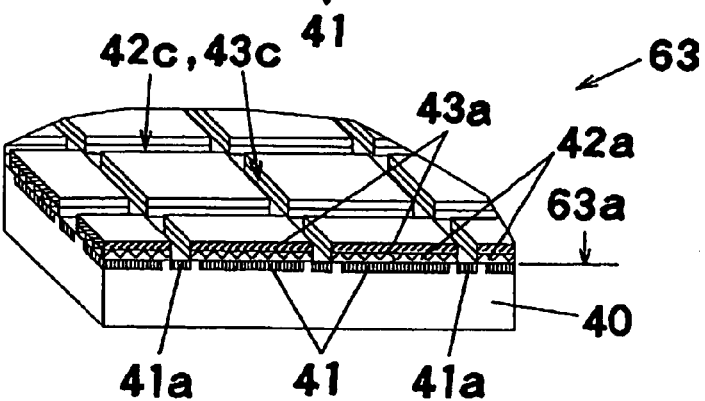

FIGS. 9(a)–9(c) are perspective views showing a semiconductor wafer of Embodiment 2 of the present invention. In Embodiment 1, two layers of $SiO_2$ layer 42 and the protective layer 43 are used as an etching stop layer. However, in this Embodiment 2, $SiO_2$ layer 42 or the protective layer 43 is singly used as an etching stop layer. Further, in this Embodiment 2, an electric conductive body used in the step of forming an active layer of the semiconductor element is used as an etching stop layer.

In FIG. 9(a), the semiconductor wafer 61 is primarily composed of a wafer base layer 40 made of silicon in the same manner as the semiconductor wafer 6. On the circuit forming face 61a (the first face) of the semiconductor wafer 61, the active layers 41 composing the circuits of individual pieces of semiconductor elements are arranged being formed into a lattice shape. Each $SiO_2$ layer 42a is formed on the upper face of the active layer 41 while each $SiO_2$ layer 42a is covering each active layer 41, and the groove-shaped gap 42b, which is formed at a position corresponding to the dicing line, is formed between the individual $SiO_2$ layers 42a.

On the front face of the circuit forming face 61a, the protective layer 43 is formed covering the individual $SiO_2$ layer 42a and the groove-shaped gap 42b. The composition of the protective layer 43 is the same as that of Embodiment 1. In the groove-shaped gap 42b which separates the individual $SiO_2$ layers 42a from each other, the protective layer 43 is recessed and enters the groove-shaped gap 42b. On the upper face of the protective film 43, the linear recess portion 43b is formed along the dicing line.

Figure 10:
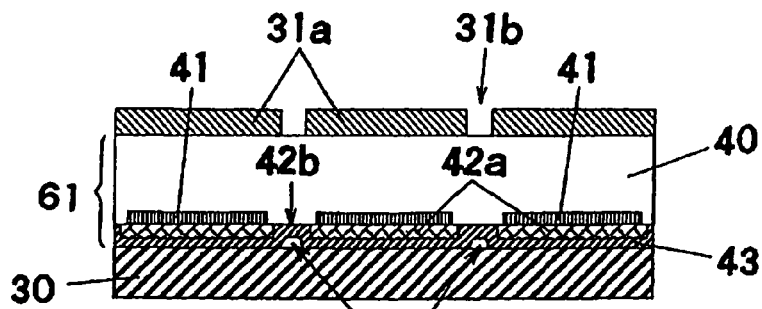
FIGS. 10(a)–10(d) are schematic illustrations for explaining a step of plasma dicing in the method of manufacturing the semiconductor device of Embodiment 2 of the present invention.
Figure 10:
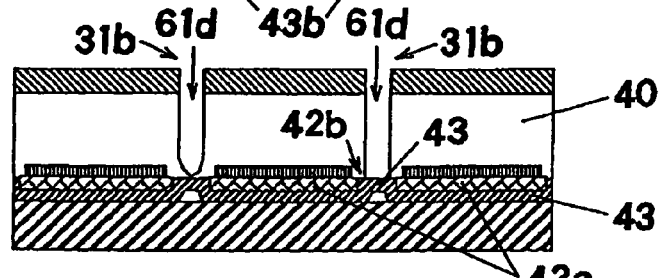
Figure 10:
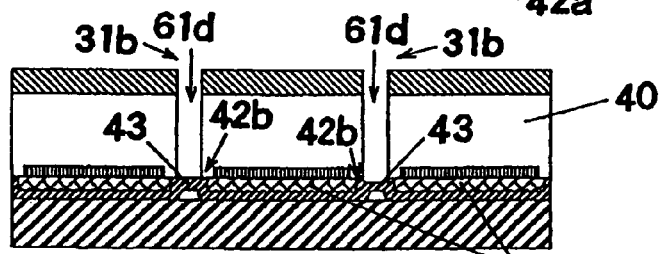
Figure 10:
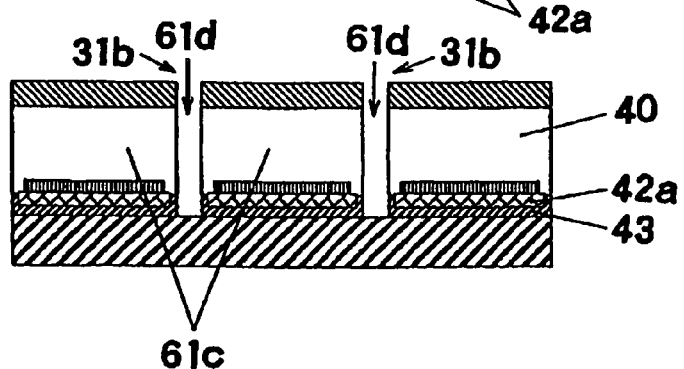

Referring to FIGS. 10(a)–10(d), the proceeding process of plasma dicing conducted on this semiconductor wafer 61 will be explained as follows. FIG. 10(a) is a view showing the semiconductor wafer 6 in the state before starting plasma dicing. The protective layer 43 is recessed and enters the groove-shaped gap 42b corresponding to the position of the cutting line 31b of cutting the mask. This recessed portion is the linear recessed portion 43b. The protective sheet 30 is attached to a surface of the protective layer 43 on the circuit forming face 61a side of the semiconductor wafer 61.

When plasma dicing is started and plasma etching is started by plasma of wafer base layer gas, the semiconductor wafer 6 is exposed to plasma of fluorine gas from the mask side (the resist film 31a side), and the cutting grooves 61d are formed only in the portions of the cutting lines 31b on the wafer base layer 40 as shown in FIG. 10(b) in the same manner as Embodiment 1. FIG. 10(b) is a view showing a state in which the formation of the cutting grooves 61d is proceeding when the plasma processing time has passed after the start of plasma etching.

At this time, in the same manner as that of Embodiment 1, due to the want of uniformity of the etching rate distribution in the processing chamber 2, the progress of plasma etching fluctuates according to the cutting grooves 31b. As shown in FIG. 10(b), at the position of the right cutting line 31b located in the range of a high etching rate, the entire thickness of the wafer base layer 40 has already been cut off and the lower end portion is formed at the position reaching the protective film 43 in the groove-shaped gap 42b. At this point of time, at the position of the left cutting line 31b located in the range of a low etching rate, the cutting groove 61d has not yet reached the lower face of the wafer base layer 40, that is, the cutting has not yet completed.

When the wafer base layer 40 has been cut off after that, the action of plasma reaches the protective film 43 in the groove-shaped gap 42b, and the cutting groove 61d starts entering the protective film 43. In FIG. 10(c), the cutting groove 61d penetrates the entire thickness of the wafer base layer 40 at the position of the left cutting line 31b located in the range of a low etching rate, and the lower end portion reaches the protective film 43 in the groove-shaped gap 42b.

In this state, plasma generating gas is changed over, and protective layer etching gas is supplied as plasma generating gas. Due to the foregoing, the protective layer 43 made of organic matter is quickly etched by plasma of gas containing oxygen. Therefore, as shown in FIG. 10(d), the cutting groove 61d penetrates the wafer base layer 40, $SiO_2$ layer 42 and the protective layer 43 and reaches the entire thickness of the semiconductor wafer 61. In this way, the semiconductor wafer 61 is divided into individual pieces of semiconductor elements 61c.

Next, the semiconductor wafer 62 shown in FIG. 9(b) will be explained below. In FIG. 9(b), in the same manner as that of the semiconductor wafer 6, the semiconductor wafer 62 is mainly composed of a wafer base layer 40 made of silicon. The active layers 41 composing the circuits of individual pieces of the semiconductor elements are arranged being formed into a lattice shape on the circuit forming face 62a (the first face) of the semiconductor wafer 62. $SiO_2$ layer 42 is formed on the upper face of the active layer 41 while $SiO_2$ layer 42 is covering the overall face of the circuit forming face 61a. On the upper faces of $SiO_2$ layers 42, the individual protective layers 43a are formed while the individual protective layers 43a are individually covering the active layers 41. The groove portion 43c, which is located at the position corresponding to the dicing line, is formed between the individual protective layers 43a.

Figure 11:
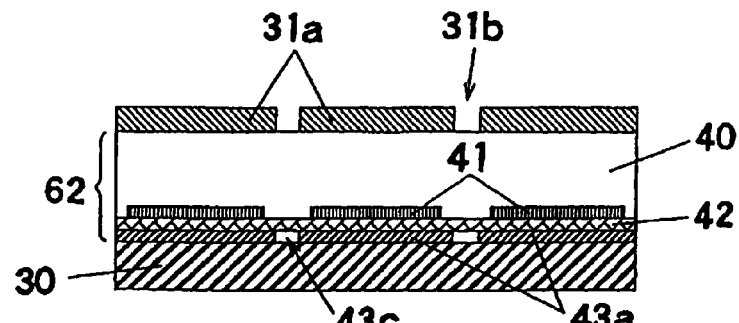
FIGS. 11(a)–11(d) are schematic illustrations for explaining a step of plasma dicing in the method of manufacturing the semiconductor device of Embodiment 2 of the present invention.
Figure 11:
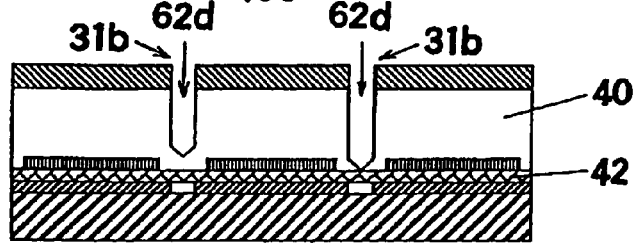
Figure 11:
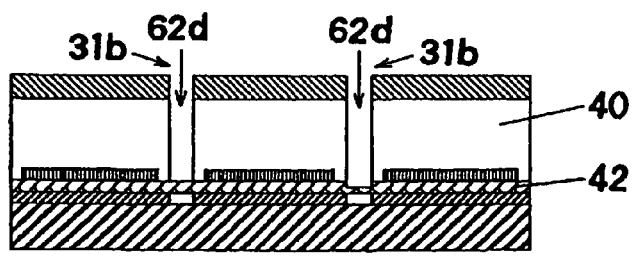
Figure 11:
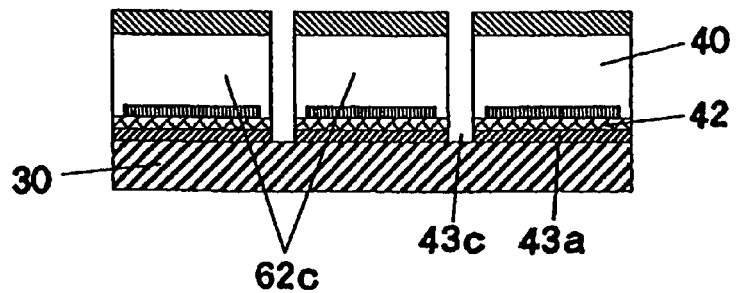

Referring to FIGS. 11(a)–11(d), the proceeding process of plasma dicing conducted on this semiconductor wafer 62 will be explained below. FIG. 11(a) is a view showing the semiconductor wafer 62 in the state before starting plasma dicing. The groove portion 43c is provided between the individual protective layers 43a corresponding to the position of the cutting line 31b of cutting the mask. The protective sheet 30 is attached to a surface of the individual protective layer 43a on the circuit forming face 62a side of the semiconductor wafer 62.

When plasma dicing is started and plasma etching is started by plasma of wafer base layer gas, the semiconductor wafer 6 is exposed to plasma of fluorine gas from the mask side (the resist film 31a side), and the cutting grooves 61d are formed only in the portions of the cutting lines 31b on the wafer base layer 40 as shown in FIG. 11(b) in the same manner as Embodiment 1. FIG. 11(b) is a view showing a state in which the formation of the cutting grooves 61d is proceeding when the plasma processing time has passed after the start of plasma etching.

At this time, in the same manner as that of Embodiment 1, due to the want of uniformity of the etching rate distribution in the processing chamber 2, the progress of plasma etching fluctuates according to the cutting grooves 31b. As shown in FIG. 11(b), at the position of the right cutting line 31b located in the range of a high etching rate, the entire thickness of the wafer base layer 40 has substantially been cut off and the lower end portion has reached $SiO_2$ layer 42. On the other hand, at the position of the left cutting line 31b located in the range of a low etching rate, the cutting groove 62d has not yet reached the lower face of the wafer base layer 40, that is, the cutting has not yet been completed.

When the wafer base layer 40 has been cut off after that, the action of plasma reaches the $SiO_2$ layer 42. In FIG. 11(c), the cutting groove 62d penetrates the entire thickness of the wafer base layer 40 at the position of the left cutting line 31b located in the range of a low etching rate, and the lower end portion reaches $SiO_2$ layer. In this state, the right cutting groove 62d has already entered $SiO_2$ layer 42.

In this state, plasma generating gas is changed over, and $SiO_2$ layer etching gas is supplied as the second plasma generating gas. Due to the foregoing, $SiO_2$ layer 42 is quickly etched by plasma of fluorine gas having hydrogen bonding, and the cutting groove 62d penetrates the wafer base layer 40 and $SiO_2$ layer 42 and connects with the groove portion 43c previously formed. In this way, the semiconductor wafer 62 is divided into individual pieces of the semiconductor elements 62c.

Next, the semiconductor wafer 63 shown in FIG. 9(c) will be explained as follows. In FIG. 9(c), the semiconductor wafer 63 is mainly composed of the base layer 40 made of silicon in the same manner as that of semiconductor wafer 6. The active layers 41 composing the circuits of individual pieces of semiconductor elements are arranged being formed into a lattice shape on the circuit forming face 63a (the first face) of the semiconductor wafer 63. The conductive layer 41a is formed between the active layers 41.

This conductive layer 41a is simultaneously formed in the circuit forming step for laying the wiring used for the active layer 41. The conductive layer 41a is made of one of the conductive bodies such as aluminum (Al), aluminum-silicon alloy (Al—Si) and aluminum-silicon-copper alloy (Al—Si—Cu). When this conductive layer 41a is used as an etching stop layer, it becomes possible to form the etching stop layer without adding a new manufacturing process.

On the upper face of each active layer 41, the individual $SiO_2$ layer 42a and the individual protective layer 43a are formed being put on each other while they are covering each active layer 41. The groove portions 42c, 43c are formed at positions corresponding to the dicing lines between the individual $SiO_2$ layer 42a and the individual protective layer 43a.

Figure 12:
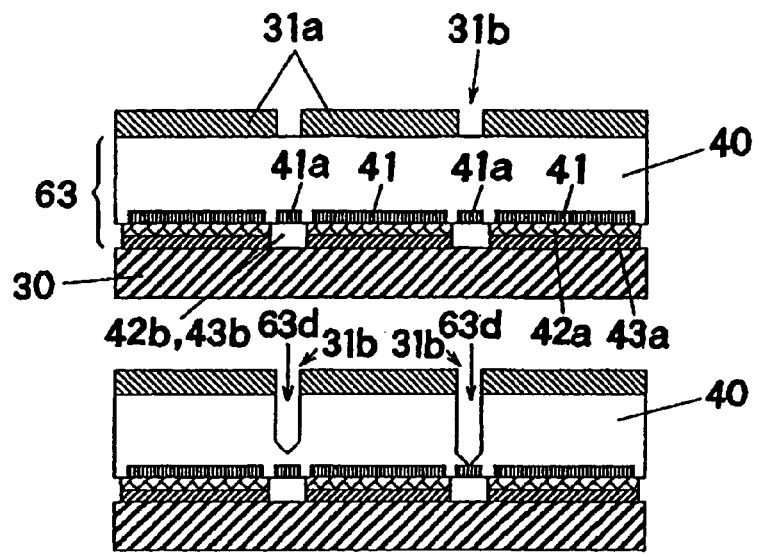
FIGS. 12(a)–12(d) are schematic illustrations for explaining a step of plasma dicing in the method of manufacturing the semiconductor device of Embodiment 2 of the present invention.
Figure 12:
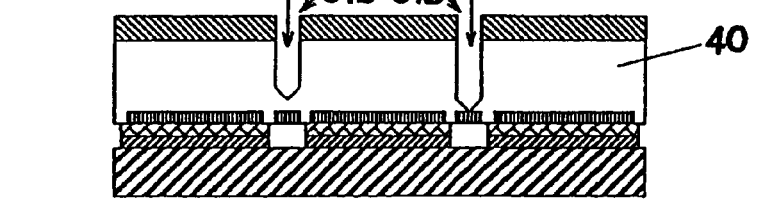
Figure 12:
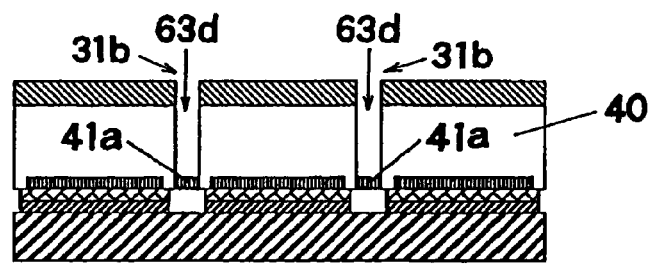

Referring to FIGS. 12(a)–12(d), the process of the progress of plasma dicing conducted on this semiconductor wafer 63 will be explained below. FIG. 12(a) is a view showing the semiconductor wafer 63 before the start of plasma dicing. The conductive layer 41a and the groove portions 42c, 43c are provided at positioned corresponding to the positions of the mask cutting lines 31b. The protective sheet 30 is attached onto a surface of the individual protective layer 43a on the circuit forming face 63a side of the semiconductor wafer 63.

When plasma dicing is started and plasma etching conducted by plasma of wafer base layer gas is started, the semiconductor wafer 63 is exposed to plasma of fluorine gas from the mask side, and the cutting grooves 63d are formed only in the portions of the cutting lines 31b on the wafer base layer 40 as shown in FIG. 12(b) in the same manner as that of Embodiment 1. FIG. 12(b) is a view showing a state in which the plasma processing time has passed after plasma etching started and the formation of the cutting grooves 63d is proceeding.

In the same manner as that of Embodiment 1, at this time, due to the want of uniformity of the etching rate distribution in the processing chamber 2, the progress of plasma etching fluctuates according to the cutting grooves 31b. Therefore, as shown in FIG. 12(b), at the point of time when the cutting groove 63d has already reached the conductive layer 41a at the position of the right cutting line 31b located in the range of a high etching rate, the cutting groove 6d has not yet reached the lower face of the wafer base layer 40 at the position of the left cutting line 31b located in the range of a low etching rate.

After that, when the wafer base layer 40 has been cut off, the cutting groove 63d reaches the conductive layer 41a. However, since the etching rate of the conductive layer 41a by the first plasma generating gas is low, as shown in FIG. 12(c), the right cutting groove 63d seldom proceeds into the conductive layer 41a even at the point of time when the left cutting groove 63d has reached the conductive layer 41a.

Figure 12D:
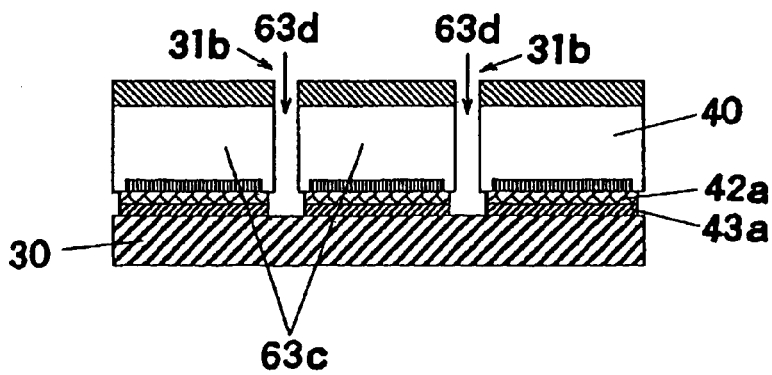

Plasma generating gas is changed over in this state, and mixed gas containing chlorine or chlorine compound (for example, $BCl_3$) is supplied as the second plasma generating gas. Due to the foregoing, the conductive layer 41a is quickly etched with plasma of the chlorine compound gas. Therefore, when the cutting grooves 63d are connected to the groove portions 42b, 43d, which are previously formed, as shown in FIG. 12(d), the semiconductor wafer 63 is divided into individual pieces of the semiconductor elements 63c.

As explained above, in the process of plasma dicing of the semiconductor wafer 6 shown in each example of this Embodiment 2, either $SiO_2$ layer 42, the protective layer 43 or the conductive layer 41a, which is formed on the circuit forming face being put on each other, is utilized as an etching stop layer for suppressing the progress of etching. Due to the foregoing, in the first plasma dicing step conducted on silicon of the wafer base layer 40, the etching stop layer functions as a buffer layer for reducing a difference between the degrees of the progress of etching made by the fluctuation of the etching rate distribution in the same manner as that of Embodiment 1.

In the second plasma etching step conducted on the etching stop layer of either $SiO_2$ layer 42, the protective layer 43 or the conductive layer 41a, since all these layers are originally thin layers and plasma generating gas capable of realizing a high etching rate is selected, etching is quickly completed in a short period of time, and the protective sheet 30 is directly exposed to plasma only for a very short period of time.

Due to the foregoing, heat damage to the protective sheet, which is caused by the want of uniformity of the etching rate, which is a problem not solved in the process of conventional plasma dicing, can be suppressed to the minimum, that is, heat damage to the protective sheet can be suppressed to the minimum, which is caused in such a manner that etching is conducted in the range of a high etching rate and even after silicon of the semiconductor wafer has been etched, the etching is successively conducted, so that the protective sheet on the lower face side of the semiconductor wafer is directly exposed to plasma.

As explained above, in the method of manufacturing a semiconductor device of each embodiment, an etching stop layer containing material, the etching rate of which is lower than the etching rate of etching conducted on silicon by plasma of fluorine gas, is formed at positions corresponding to the dicing lines of a semiconductor wafer. After the first plasma dicing step in which a wafer base layer made of silicon is etched with mixed gas containing fluorine gas which is the first plasma generating gas, the second plasma dicing step is conducted in which the etching stop layer such as $SiO_2$ layer and a protective layer, which are exposed by the first plasma dicing step, is etched with the second plasma generating gas capable of etching at a higher etching rate than the etching rate of plasma of fluorine gas.

Due to the foregoing, the fluctuation of the progress of etching generated by the want of uniformity of the etching rate in the process of etching the wafer base layer can be absorbed by the buffer function of the etching stop layer. In the process of etching conducted on the etching stop layer, when plasma generating gas capable of realizing a higher etching rate is selected and used according to the composition of the etching stop layer, etching can be quickly completed in a short period of time. Accordingly, even after the completion of etching conducted on the semiconductor wafer, heat damage to the protective sheet caused by plasma can be prevented.

According to the present invention, the etching stop layer containing material, the etching rate of which is lower than the etching rate of etching conducted on silicon by plasma of the first plasma generating gas, is formed at positions corresponding to the cutting lines of a semiconductor wafer. After the first plasma dicing step in which silicon is etched with plasma of the first plasma generating gas, the second plasma dicing step is conducted in which the etching stop layer exposed by the first plasma dicing step is etched with plasma of the second plasma generating gas capable of etching at a higher etching rate than the etching rate of plasma of the first plasma generating gas. Therefore, it is possible to prevent the occurrence of heat damage caused on the protective sheet in the process of cutting the semiconductor wafer by plasma etching.

What is claimed is:

1. A method of manufacturing a semiconductor device for obtaining the semiconductor device divided into individual pieces of semiconductor elements by cutting a semiconductor wafer, the primary component of which is silicon, on the first face of which the plurality of semiconductor elements are formed, by means of plasma dicing, the method of manufacturing the semiconductor device comprising:

a step of forming an etching stop layer on the first face side at positions corresponding to cutting lines which are set by dividing the semiconductor wafer into the individual pieces, the etching stop layer containing material, the etching rate of the material by plasma, in which a first plasma generating gas of mixed gas containing fluorine gas is used, being lower than an etching rate of etching silicon by plasma in which the first plasma generating gas is used;

a step of attaching a protective sheet, which is capable of being peeled off, onto the first face to form a mask for determining the cutting lines on a second face opposite to the first face;

a first plasma dicing step of etching silicon from the second face side by plasma of the first plasma generating gas; and a second plasma dicing step of etching the etching stop layer, which is exposed in the first plasma dicing step, by a second plasma generating gas capable of etching at a higher etching rate than the etching rate of the first plasma generating gas.

2. A method of manufacturing a semiconductor device according to claim 1, wherein a ratio of the etching rate of etching silicon by plasma, in which the first plasma generating gas is used, to the etching rate of etching the etching stop layer by plasma, in which the first plasma generating gas is used, is not more than 0.6.

3. A method of manufacturing a semiconductor device according to claim 1, wherein the etching stop layer contains at least $SiO_2$, and the second plasma generating gas contains fluorine gas having hydrogen bonding or alternatively contains mixed gas containing fluorine gas.

4. A method of manufacturing a semiconductor device according to claim 3, wherein the second plasma generating gas contains mixed gas containing $CHF_3$ or $CF_4+H_2$.

5. A method of manufacturing a semiconductor device according to claim 1, wherein the etching stop layer contains at least SiN, and the second plasma generating gas is mixed gas containing at least fluorine gas and oxygen.

6. A method of manufacturing a semiconductor device according to claim 5, wherein the second plasma generating gas contains mixed gas containing $SF_6$ and $O_2$.

7. A method of manufacturing a semiconductor device according to claim 1, wherein the etching layer contains at least organic matter, and the second plasma generating gas contains at least oxygen.

8. A method of manufacturing a semiconductor device according to claim 1, wherein the etching stop layer contains at least an electric conductor used for the wiring of semiconductor elements.

9. A method of manufacturing a semiconductor device according to claim 8, wherein the electric conductor contains at least one of Al, Al—Si and Al—Si—Cu, and the second plasma generating gas contains at least chlorine or chlorine compound gas.

10. A cutting device of cutting a semiconductor wafer used for the method of manufacturing a semiconductor device, comprising:

a processing chamber of forming a tightly closed space;

an electrode having a plane tightly coming into contact with a protective sheet;

a holding means for holding the semiconductor wafer by the electrode under the condition that the protective sheet is tightly contacted with the plane;

a pumping means for decompressing the processing chamber;

a plasma generating gas supply section of supplying plasma generating gas into the processing chamber; and a high frequency electric power supply section of impressing a high frequency voltage upon the electrode so as to transfer plasma processing gas, which is supplied into the processing chamber, into a state of plasma, wherein the plasma generating gas supply section includes a gas selecting means for selectively supplying the first plasma generating gas used in the first plasma dicing step or the second plasma generating gas for generating plasma capable of etching the etching stop layer, which is exposed by the first plasma dicing step, at a higher etching rate than the etching rate of plasma of the first plasma generating gas.

* * * * *